(12) United States Patent
Chou et al.

(10) Patent No.: US 6,531,858 B2
(45) Date of Patent: Mar. 11, 2003

(54) METHOD FOR MEASURING DRIFT VALUES OF AN ISFET USING THE HYDROGENATED AMORPHOUS SILICON AS A SENSING FILM

(75) Inventors: Jung Chuan Chou, Yunlin Hsien (TW); Hsuan Ming Tsai, Tainan Hsien (TW)

(73) Assignee: National Yunlin University of Science and Technology, Yunlin (TW)

( * ) Notice: Subject to any disclaimer, the term of this patent is extended or adjusted under 35 U.S.C. 154(b) by 0 days.

(21) Appl. No.: 09/780,239

(22) Filed: Feb. 9, 2001

(65) Prior Publication Data

US 2002/0033705 A1 Mar. 21, 2002

(30) Foreign Application Priority Data

Sep. 16, 2000 (TW) .................................. 89119028 A

(51) Int. Cl.⁷ ..................... G01N 27/00; G01R 31/26; H01L 31/00; H01L 31/20
(52) U.S. Cl. ..................... 324/71.1; 438/14; 257/57; 257/414
(58) Field of Search .......................... 205/789; 324/750, 324/71.1; 257/253, 57, 414; 438/151, 158, 14

(56) References Cited

U.S. PATENT DOCUMENTS

| | | | |
|---|---|---|---|
| 4,657,658 A | 4/1987 | Shibbald | |
| 4,812,220 A | 3/1989 | Iida et al. | |
| 5,314,833 A | 5/1994 | Lee et al. | |
| 5,319,226 A | 6/1994 | Sohn et al. | |
| 5,350,701 A | 9/1994 | Jaffrezic-Renault et al. | |
| 5,387,328 A | 2/1995 | Sohn | |
| 5,397,920 A * | 3/1995 | Tran .......................... | 257/749 |
| 5,414,284 A | 5/1995 | Baxter et al. | |
| 5,602,467 A | 2/1997 | Krauss et al. | |
| 5,833,824 A | 11/1998 | Benton | |
| 5,911,873 A | 6/1999 | McCarron et al. | |

* cited by examiner

Primary Examiner—Kamand Cuneo
Assistant Examiner—Paresh Patel
(74) Attorney, Agent, or Firm—Darby & Darby

(57) ABSTRACT

A method of measuring the the drift value of an a-Si:H ISFET) has the steps of: (1) using a constant voltage/current circuit to fix the drain/source current and the drain/source voltage of the a-Si:H ISFET; (2) dipping the sensing film into a buffer solution; (3) recording the gate/source output voltage of the a-Si:H ISFET by using a voltage-time recorder; and (4) exchanging the pH value of the buffer solution and then repeating the steps of (1)–(3).

6 Claims, 4 Drawing Sheets

METHOD FOR MEASURING DRIFT VALUES OF AN ISFET USING THE HYDROGENATED AMORPHOUS SILICON AS A SENSING FILM

BACKGROUND OF THE INVENTION

1. Field of the Invention

The present invention relates in general to a method and an apparatus for measuring the hysteresis and drift behaviors of an ISFET. In particular, the present invention relates to a method and an apparatus for measuring the hysteresis and drift behaviors of an ISFET that uses the hydrogenated amorphous silicon as a sensing film.

2. Description of the Related Art

The ion sensitive field effect transistor (ISFET) is constructed by substituting a sensing film for the metal gate on the gate oxide of a traditional MOSFET. When the ISFET is dipped into a solution, the interfacial potential between the sensing film and the solution will influence the semiconductor surface since only an extremely thin dielectric (that is, the gate oxide) separates the sensing film and the semiconductor surface. This influences the charge density in the inversion layer of the semiconductor surface, and thereby modulates the channel current passing through the ISFET. Therefore, by utilizing this characteristic, the pH value or other ion concentration in the solution can be deduced from the measurement of source/drain current and the gate voltage of the ISFET. Furthermore, the potential difference in the interface between the sensing film and the solution is in relation to the ion activity in the solution. The hydrogen ion activity in the solution can be measured by using different channel currents caused by different interfacial potential differences in various solutions with different hydrogen ion activity.

The patents, which are related to the formation of the ISFET or the measurement of the ISFET, are listed hereinafter.

(1) U.S. Pat. No. 5,414,284 discloses a method of fabricating an ISFET and an ESD protective circuit on the same silicon substrate, wherein a capacitor is utilized as an interface between the protective circuit and a sample solution to isolate the D.C. leakage current.

(2) U.S. Pat. No. 5,911,873 discloses a method and an apparatus for determining and controlling the zero potential point by measuring currents and gate voltages. Also, an apparatus for measuring the ion concentration in the solution is provided with an ISFET, a reference electrode, a control circuit, a memory, a measuring circuit and a diagnostic circuit. The control circuit makes the ISFET operate under a drain-source currents and plurality of continuous drain current and gate voltages. The measuring circuit and diagnostic circuit measure the ion concentration and the device characteristics. Finally, the measuring results are recorded in the memories.

(3) U.S. Pat. No. 5,833,824 discloses an ISFET sensor for sensing the ion activity in the solution includes a substrate and an ISFET semiconductor die. The substrate has the front surface exposed to the solution, a back surface opposites to the front surface and an aperture extending between the front and back surface. A sensing film of the ISFET is mounted to the back surface such that the gate region is exposed to the solution through the aperture.

(4) U.S. Pat. No. 5,602,467 discloses a method of measuring the ion concentration in the solution by using two differential amplified circuits that are composed of four ISFETs and four FETs. The circuit configuration shows the difference between two ISFETs. Also, the technical errors, the variation in parameters during operation and the effects of environment can be ignored. The circuit comprises two amplifiers, and the amplifiers comprise two ISFETs and a FETs that are different or identical. The output of the first amplifier occurs the difference of the mean value of the ISFET threshold voltage and the FET threshold voltage, and the output of the second amplifier occurs the difference of the two ISFET threshold voltages.

(5) U.S. Pat. No. 5,387,328 provides a method of measuring the glucose concentration by fixing the enzyme on a sensing film and using platinum (Pt) as a reference electrode. The sensor has a Pt electrode being capable of sensing all biological substances which generate $H_2O_2$ in enzyme reaction, whereby having the high sensitivity and rapid time.

(6) U.S. Pat. No. 5,350,701 provides a method of measuring the content of alkaline-group metals, especially the content of the calcium ions, by utilizing chemosynthesis phosphide group as the sensing film on a gate of an ISFET.

(7) U.S. Pat. No. 5,319,226 discloses a $Ta_2O_5$ sensing film deposited by using a radio frequency sputtering method on an ISFET, wherein the ISFET consists of a $Ta_2O_5/Si_3N_4/SiO_2$ structure. In this case, a $Ta_2O_5$ film of the thickness between 400~500 Å is formed on a $Si_3N_4/SiO_2$ dielectric, and the $Ta_2O_5$ film outside the gate is removed by a lift-off process utilizing a positive PR film. The $Ta_2O_5$ gate ph-ISFET according to the present invention has higher sensitivity and more stable, while the productivity and stability thereof are greatly improved affecting a whole wafer process.

(8) U.S. Pat. No. 5,314,833 discloses a method which depositing a silicon film on a GaAs substrate and doping arsenic/phosphorous ions into the silicon film to fabricate the gate with lower resistance. This can reduce the thermal effect on the device, and improve the operation characteristics.

(9) U.S. Pat. No. 4,812,220 provides an ISFET made by fixing the enzyme on the sensing film for measuring the concentration of the amino acid in food. The enzyme sensor is miniaturization, and can accurately measure the concentration even when the content of the amino acid is small.

(10) U.S. Pat. No. 4,657,658 provides a differential pair modular system composed of a MOS transistor and an ISFET. Also, a semiconductor IC circuit for sensing surrounding physical/chemical characteristics is provided, which comprises a pair of semiconductor devices similar to a geometric and physical structure. One semiconductor device is employed to sense the characteristics. The other semiconductor device that is insensitive connected to another pair of semiconductor devices to form a feedback loop together with a differential amplifier.

However, in the ISFET applications, many factors such as the hysteresis and drift behaviors affect the accuracy of the measuring results. With reference to the hysteresis behavior, it is related to the change in the pH value of the solution (such as $pH_x \rightarrow pH_y \rightarrow pH_x \rightarrow pH_z \rightarrow pH_x$) and the corresponding change in the output voltage of the ISFET (such as $V_{ox1} \rightarrow V_{oy} \rightarrow V_{ox2} \rightarrow V_{oz} \rightarrow V_{ox3}$). At the same pH value, the difference between the first output voltage and the final output voltage (such as $V_{ox3}-V_{ox1}$) is defined as the hysteresis value. As to the drift behavior, the drift value is defined as the change in the gate voltage per unit time on conditions that the source/drain current is stable and the temperature is constant. To improve the accuracy of the measuring results, measure the hysteresis value and the drift value to get the accurate output value of the ISFET by using a reverse compensation method after measuring all output values in an ordinary experiment.

Besides, the common ISFET has a sensing film made of $Al_2O_3$, $Ta_2O_5$ or $Si_3N_4$, the cost of which is extremely high and the production of which needs a long time. This product is not applicable to mass production, and cost thereof is much greater.

SUMMARY OF THE INVENTION

An object of the present invention is to provide a method of measuring the hysteresis value and the drift value of the a-Si:H ISFET so as to use the reverse compensation method to obtain the accurate output value.

Another object of the present invention is to provide an apparatus for measuring the hysteresis value and the drift value of the a-Si:H ISFET, wherein the process of forming the a-Si:H ISFET is easy, the cost is lower and applied to mass production.

To achieve the object of the present invention, a method of measuring the hysteresis value of an a-Si:H ISFET is provided, which comprises the steps of: (a1) using a constant voltage/current circuit to fix the drain/source current and the drain/source voltage of the a-Si:H ISFET; (a2) dipping the sensing film into a buffer solution; (a3) recording the gate/source output voltage of the a-Si:H ISFET by using a voltage-time recorder; and (a4) exchanging the pH value of the buffer solution and then repeating the steps of (a1)~(a3) so as to measure the hysteresis value of the a-Si:H ISFET.

To achieve another object of the present invention, a method of measuring the drift value of an a-Si:H ISFET is provided, which comprises the steps of: (b1) sing a constant voltage/current circuit to fix the drain/source current and the drain/source voltage of the a-Si:H ISFET; (b2) dipping the sensing film into a buffer solution; and (b3) recording the gate/source output voltage of the a-Si:H ISFET during a constant period by using a voltage-time recorder so as to measure the drift value of the a-Si:H ISFET.

To achieve another object of the present invention, an apparatus for measuring the hysteresis value and the drift value is provided, which comprises an a-Si:H ISFET that is formed on a semiconductor substrate and comprises source/drain regions which isolate each other and a sensing film made of the hydrogenated amorphous silicon; a buffer solution for touching the a-Si:H ISFET; a light-isolation container for isolating light and carrying the devices; a heater for heating the buffer solution; a constant current/voltage circuit connected to the source and drain of the a-Si:H ISFET; a current/voltage measuring device connected to the constant current/voltage circuit; and a voltage-time recorder connected to the constant current/voltage circuit.

This and other objectives of the present invention will no doubt become obvious to those of ordinary skills in the art after having read the following detailed description of the preferred embodiment, which is illustrated in the various figures and drawings.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Figure 1:
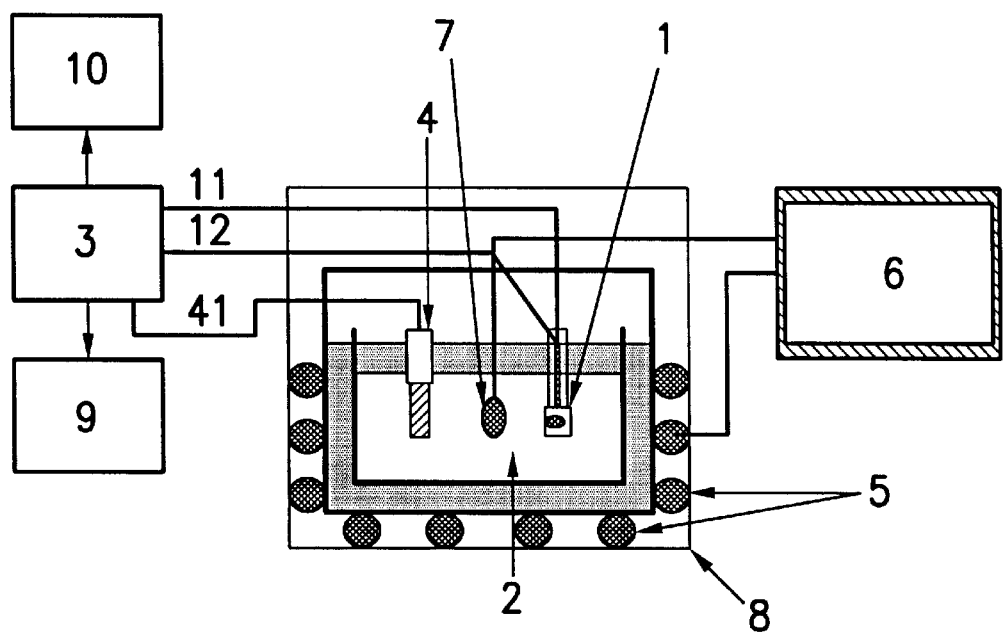
FIG. 1 shows a schematic diagram according to the present invention.

Please refer to FIG. 1, which shows a schematic diagram according to the present invention. An ISFET 1 using the hydrogenated amorphous silicon as a sensing film (called a-Si:H ISFET) is dipped into a buffer solution 2 that is made by a standard buffer solution and carried by a container (not labeled). A drain/source (not shown) of the a-Si:H ISFET 1 is connected to a constant voltage/current circuit 3 (such as a negative feedback circuit) through two wires 11,12. The constant voltage/current circuit 3 is utilized to fix the drain/source voltage and the drain/source current of the a-Si:H ISFET 1.

A reference electrode 4 is installed in the buffer solution 2, wherein one end of the reference electrode 4 is connected to the constant voltage/current circuit 3 through a wire 41. A heater 5 installed outside the container is connected to a PID temperature controller 6. Both of the heater 5 and the PID temperature controller 6 are used for keeping the buffer solution 2 at a constant temperature (preferred at 25° C.) that is detected by a thermocouple 7 connected to the PID temperature controller 6. The above-mentioned buffer solution 2, every device connecting thereto and the heater 6 are placed in a light-isolation container 8 (preferred as a dark chamber) for reducing the light effect on the measuring results.

The constant voltage/current circuit 3 is connected to a current/voltage measuring device 9 that comprises two digital multimeter for detecting whether the source/drain current and the source/drain voltage of the a-Si:H ISFET 1 trend towards stability. Also, the constant voltage/current circuit 3 is connected to a voltage-time recorder 10 for setting and recording the output voltages during each recording period.

Figure 2:
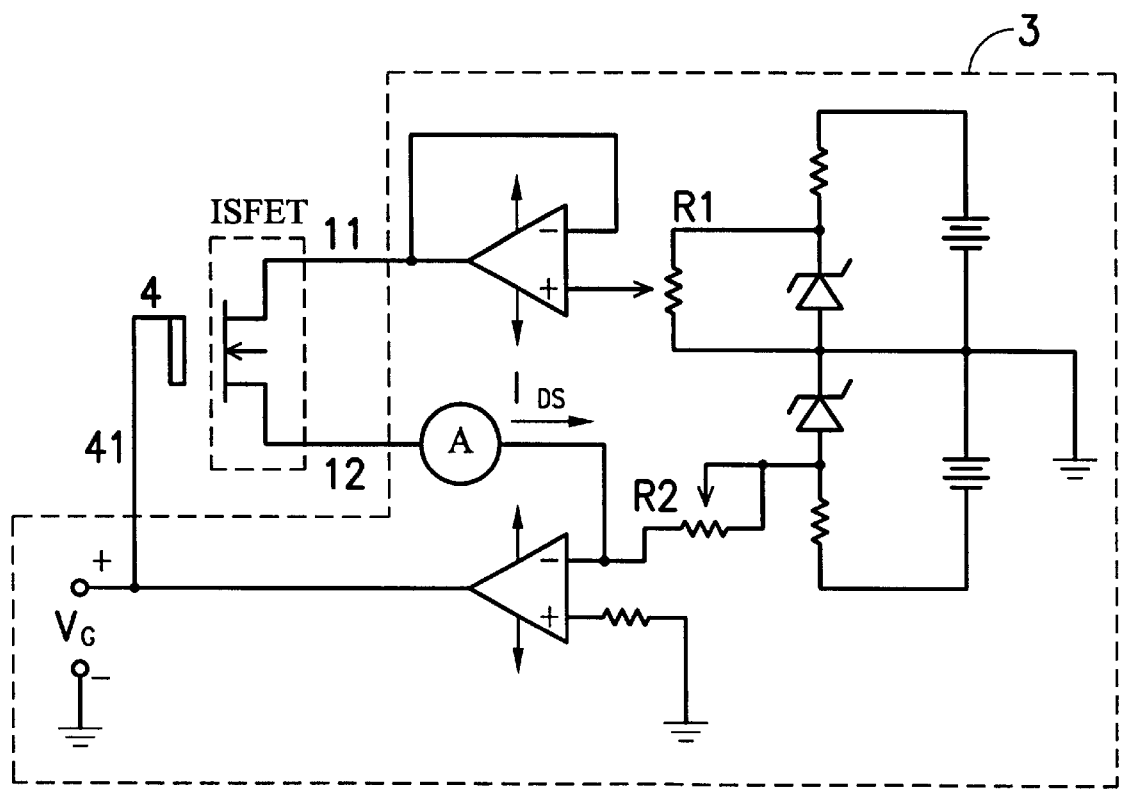
FIG. 2 shows a schematic diagram of the constant voltage/current circuit according to the present invention.

Please refer to FIG. 2, which shows a schematic diagram of the constant voltage/current circuit 3 according to the present invention. The constant voltage/current circuit 3 is connected to the source/drain of the a-Si:H ISFET 1 through the wires 11,12, and is connected to the reference electrode 4 through the wire 41. By adjusting the variable resistance R1, the source-drain voltage can be fixed at a constant value (preferred at 0.2 V). By adjusting the variable resistance R2, the source-drain current can be fixed at a constant value (preferred at 80 μA). In the case of the negative feedback, when the increasing drain-source current $I_{DS}$ increases the source voltage, the output voltage and gate voltage are reduced and finally the drain-source current $I_{DS}$ is reduced. The circuit 3 has advantages of simplicity, inexpensiveness, ease of operation and no need to adjust the measuring point of the device.

Figure 3:
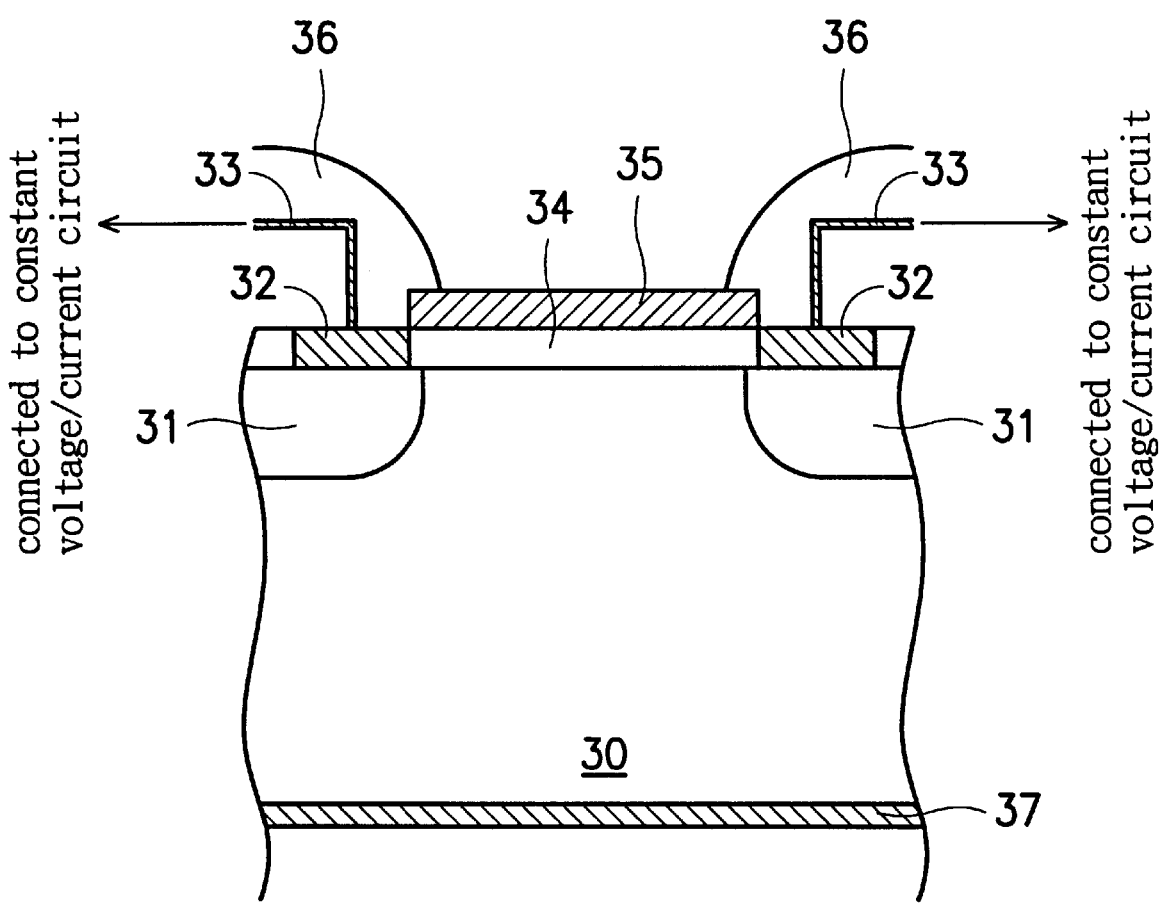
FIG. 3 shows a cross-sectional schematic diagram of the a-Si:H ISFET according the present invention.

Please refer to FIG. 3, which shows a cross-sectional schematic diagram of the a-Si:H ISFET according the present invention. The a-Si:H ISFET is formed on a semiconductor substrate 30 (a p-type silicon substrate is preferred). A pair of source/drain regions 31 is formed approaching the top surface of the semiconductor substrate 30, and is connected to a constant voltage/current circuit by an aluminum-made contact layer 32 and a metal line 33. On the surface of the semiconductor substrate 30 between the two source/drain regions 31, a gate oxide layer 34 made of silicon oxide and an a-Si:H sensing film 35 are formed sequentially. An epoxy layer 36 seals the device but expose the a-Si:H sensing film 35. Furthermore, an aluminum layer 37 is formed at the bottom of the semiconductor substrate 30 for the decreasing channel-adjusting effect.

It should be noticed that the a-Si:H sensing film 35 can be fabricated by using the plasma enhanced chemical vapor deposition (PECVD) method. Since the PECVD method employs $SiH_4$ as the reactive gas and uses the radio refrequency (RF) with low power, the deposition process can make the temperature of the semiconductor substrate lower and is applied to any semiconductor substrate made of various shapes, sizes and materials. Also, the deposition process can be performed together with other semiconductor processes. Therefore, the a-Si:H ISFET of the present invention, having the advantage of low cost, is applied to mass production and industrial usage.

Hereinafter, a method is described for measuring the hysteresis value and the drift value of the a-Si:H ISFET in detail.

With reference to the hysteresis value, at the step a1, the constant voltage/current circuit (negative feedback circuit) is utilized to fix the drain/source current and the drain/source voltage of the a-Si:H ISFET. At the step a1, the a-Si:H ISFET and the reference electrode are connected to the constant voltage/current circuit, and then dipped into the solution. Next, by adjusting the variable resistance R1, the $V_D$ value is set at 0.2 V by one digital multimeter. Also, by adjusting the variable resistance R2, the $I_{DS}$ value is set at 80 $\mu$A by the other digital multimeter. Next, the a-Si:H ISFET is placed into a standard solution to keep up a stable state.

Figure 4:
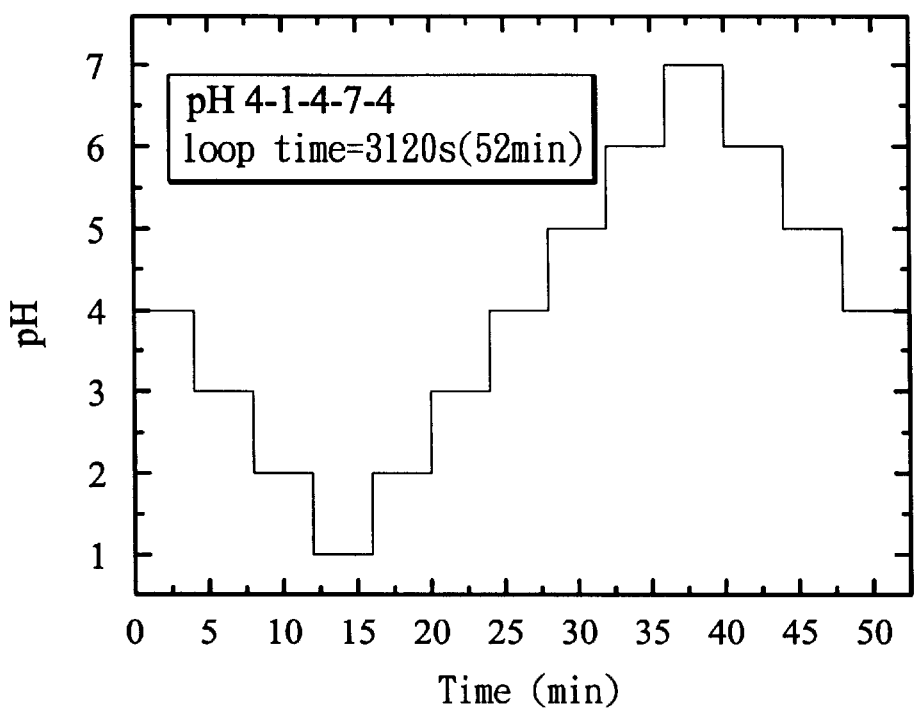
FIG. 4 shows the relationship between the pH values and time in the hysteresis measurement.

Afterwards, at step a2, the a-Si:H ISFET is dipped into the buffer solution. At step a3, the voltage-time recorder is utilized to record the gate/source output voltages of the a-Si:H ISFET. At step a4, the hysteresis value of the a-Si:H ISFET is measured in accordance with the change in the pH value of the buffer solution. It is noticed that the a-Si:H ISFET is easily dissolved in alkaline solution, thereby the hysteresis value should be selectively measured when the pH value of the buffer solution is about 1~7. In the preferred embodiment, the hysteresis value is measured in pH value= 4-1-4-7-4 order wherein each measuring result is at the time when the pH value is changed for four minutes, the loop time is 3120 seconds, and one time the pH value changes one unit. Particularly, choosing the pH value=4-1-4-7-4 order is to measure the hysteresis values within the pH value range between 1 and 7. The relationship among the hysteresis values, the pH values and time are shown in FIG. 4.

Figure 5:
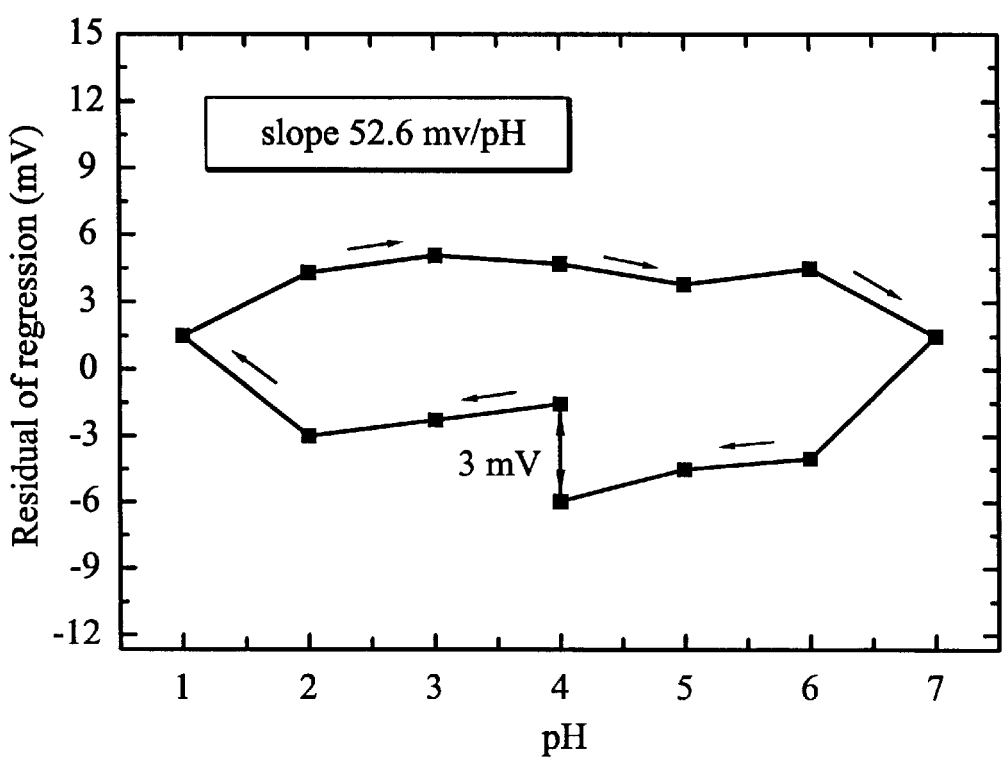
FIG. 5 shows a residual regression diagram for a-Si:H gate-ISFET at loop time of 3120 S.

According to the above-mentioned measuring method, the measuring results and the pH values are drawn as a residual regression diagram in FIG. 5. It is obvious that the hysteresis value is 3 mV when pH value is 4. By using the same method, all of the hysteresis values at different pH values can be found out and those are helpful to perform the reverse compensation method.

With reference to the drift value, at step b1, the constant voltage/current circuit (negative feedback circuit) is utilized to fix the drain/source current and the drain/source voltage of the a-Si:H ISFET. At the step b1, the a-Si:H ISFET and the reference electrode are connected to the constant voltage/current circuit, and then dipped into the solution. Next, by adjusting the variable resistance R1, the $V_D$ value is set at 0.2 V by one digital multimeter. Also, by adjusting the variable resistance R2, the $I_{DS}$ value is set by the other digital multimeter. Afterwards, at step b2, the a-Si:H ISFET is dipped into the buffer solution for a period time. At step b3, the voltage-time recorder is utilized to record the gate/source output voltage of the a-Si:H ISFET, and thereby measure the drift values.

It should be noticed that a current generated by illumination affects the drift value. Hence, the drain-source current should be adjusted at between 10 $\mu$A and more than one hundred $\mu$A to reduce the illumination effect. Besides, when the drain-source current is extremely large, the stability is affected by temperature easily. Accordingly, the preferred embodiment is to set the drain-source current at 10~300 $\mu$A.

Figure 6:
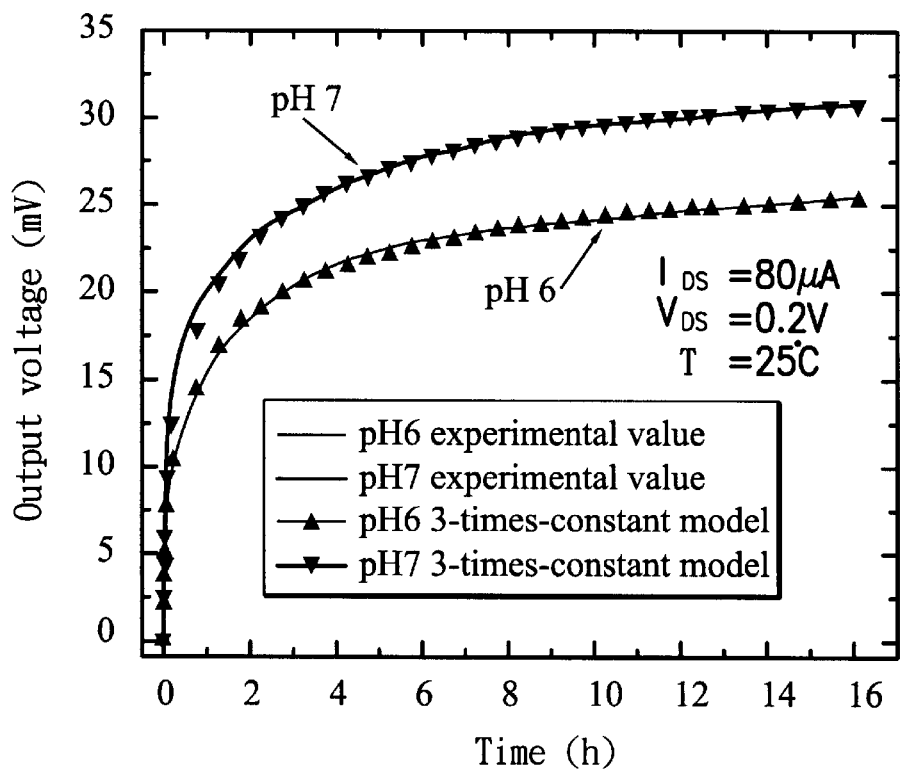
FIG. 6 shows curves of the relation between gate/source output voltage and time when the pH value is 6 and 7.

Please refer to FIG. 6, which shows curves of the relationship between gate/source output voltage and time when the pH value is 6 or 7. Two kinds of data are shown in the curve, wherein one kind of data is the experimental result (shown as a line) by using the method of the present invention, and the other kind of data is the simulated result (shown as triangles) by using a multiple time-constant model. It is obvious that the simulated result matches the experimental result well. The drift value can be found from the slope of the curve whose time parameter is more than the fifth hour.

Figure 7:
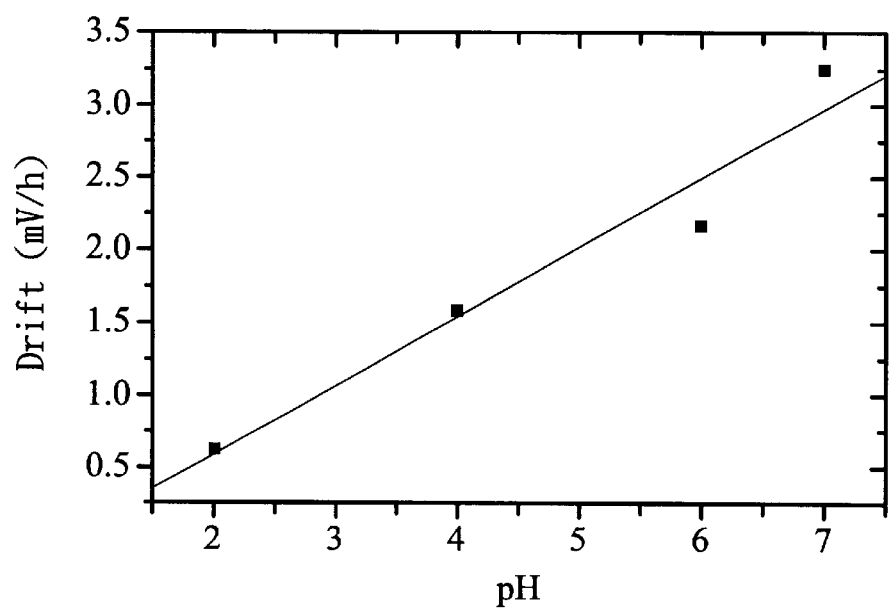
FIG. 7 shows the relation between the drift values and the pH values.

Please refer to FIG. 7, which shows the relationship between the drift values and the pH values. At pH=2, the drift value is 0.64 mV/h; at pH=4, the drift value is 1.58 mV/h; at pH=6, the drift value is 2.17 mV/h; at pH=7, the drift value is 3.24 mV/h. According to the data, it is believed that the drift behavior is more obvious when the pH value is larger. Also, when the data approximately forms a line, the drift values at any other pH values can be estimated. This is good for doing the reverse compensation.

Those skilled in the art will readily observe that numerous modifications and alterations of the device may be made while retaining the teaching of the invention. Accordingly, the above disclosure should be constructed as limited only by the metes and bounds of the appended claims.

What is claimed is:

1. A method of measuring the drift value of an ISFET that uses the hydrogenated amorphous silicon as a sensing film (called a-Si:H ISFET), comprising the steps of:

(b1) using a constant voltage/current circuit to fix the drain/source current and the drain/source voltage of the a-Si: H ISFET;

(b2) dipping the sensing film into a buffer solution; and (b3) recording the gate/source output voltage of the a-Si:H ISFET during a constant period by using a voltage-time recorder so as to measure the drift value of the a-Si:H ISFET.

2. The method as claimed in claim 1, further comprising the step of exchanging the pH value of the buffer solution to measure the drift values at different pH values.

3. The method as claimed in claim 2, wherein the drift value is the change in the gate/source output voltage per unit of time.

4. The method as claimed in claim 1, wherein the source-drain current is fixed at 50 $\mu$A, and the drain-source voltage is fixed at 0.2 V.

5. The method as claimed in claim 1, prior to the step of (b2), further comprising a step of dipping the a-Si:H ISFET into a standard solution to keep up stability.

6. The method as claimed in claim 1, wherein the gate/source output voltage of the a-Si:H ISFET is recorded for more than twelve hours.

* * * * *